(12) United States Patent
Park et al.

(10) Patent No.: US 7,229,747 B2
(45) Date of Patent: Jun. 12, 2007

(54) METHOD OF MAKING CARBON NANOTUBE PATTERNED FILM OR CARBON NANOTUBE COMPOSITE USING CARBON NANOTUBES SURFACE-MODIFIED WITH POLYMERIZABLE MOIETIES

(75) Inventors: Jong Jin Park, Gyeonggi-Do (KR); Jung Han Shin, Gyeonggi-Do (KR); Sang Yoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 358 days.

(21) Appl. No.: 10/786,592

(22) Filed: Feb. 26, 2004

(65) Prior Publication Data

US 2004/0265755 A1 Dec. 30, 2004

(30) Foreign Application Priority Data

Feb. 26, 2003 (KR) .................. 10-2003-0011898

(51) Int. Cl.
*G03C 5/00* (2006.01)
(52) U.S. Cl. .................. 430/322; 430/311; 430/270.1; 430/325; 977/842; 427/385.5
(58) Field of Classification Search .................. None
See application file for complete search history.

(56) References Cited

U.S. PATENT DOCUMENTS

| | | | |
|---|---|---|---|
| 5,691,101 A * | 11/1997 | Ushirogouchi et al. | 430/176 |
| 6,033,740 A * | 3/2000 | Oelbrandt et al. | 427/511 |
| 6,777,159 B1 * | 8/2004 | Itatani et al. | 430/270.1 |
| 6,872,503 B2 * | 3/2005 | Wheland et al. | 430/270.1 |

OTHER PUBLICATIONS

Noriaki Hamada et al., "New One-Dimensional Conductors: Graphitic Microtubules", Physical Review Letters, 1992, pp. 1579-1581, vol. 68, No. 10, The American Physical Society.

Riichiro Saito et al., "Electronic Structure of Graphene Tubules Based on $C_{60}$", Physical Review B, 1992, pp. 1804-1811, vol. 46, No. 3, The American Physical Society.

Zxhongfan Liu et al., "Organizing single-Walled Carbon Nanotubes on gold Using a Wet Chemical Self-Assembling Technique", Langmuir The ACS Journal of Surfaces and Colloids, 2000, pp. 3569-3573, vol. 16, No. 8, American Chemical society, Published on Web Mar. 24, 2000.

Jie Liu et al., "Controlled Deposition of Individual Single-Walled Carbon Nanotubes on Chemically Functionalized Templates", Chemical Physics Letters, 1999, pp. 125-129, vol. 303, Elsevier Science B.V.

Milo S. P. Shaffer et al., "Fabrication and Characterization of Carbon Nanotube/Poly(vinyl alcohol) Composites", Advanced Materials, 1999, pp. 937-941, vol. 11, No. 11, Wiley-VCH Verlag GmbH, Weinheim, Germany.

Xiaoyi Gong et al., "Surfactant-Assisted Processing of Carbon Nanotube/Polymer Composites", Chemical Mater., 2000, pp. 1049-1052, vol. 12, American Chemical Society.

* cited by examiner

*Primary Examiner*—John A. McPherson
*Assistant Examiner*—Daborah Chacko-Davis
(74) *Attorney, Agent, or Firm*—Buchanan Ingersoll & Rooney PC

(57) ABSTRACT

Disclosed herein are methods of making a negative pattern of carbon nanotubes or a polymerized carbon nanotube composite having an interpenetrating polymer network (IPN) by modifying the surfaces of the carbon nanotubes with polymerizable functional groups such as oxirane and anhydride groups and subjecting the surface-modified carbon nanotubes either to a photolithography process or to a heatcuring process. By virtue of the present invention, desired patterns of carbon nanotubes can be easily made on the surfaces of various substrates, and polymerized carbon nanotube composites improved in hardening properties can be made without additional polymers.

14 Claims, No Drawings

METHOD OF MAKING CARBON NANOTUBE PATTERNED FILM OR CARBON NANOTUBE COMPOSITE USING CARBON NANOTUBES SURFACE-MODIFIED WITH POLYMERIZABLE MOIETIES

BACKGROUND OF THE INVENTION

This non-provisional application claims priority under 35 U.S.C. § 119(a) from Korean Patent Application No. 2003-11898 filed on Feb. 26, 2003, which is herein incorporated by reference.

1. Field of the Invention

The present invention relates to methods of making a patterned film or a carbon nanotube composite using carbon nanotubes having polymerizable moieties on their surfaces. More specifically, the present invention relates to methods of making a carbon nanotube negative pattern or a polymerized carbon nanotube composite having interpenetrating polymer network by modifying the surfaces of the carbon nanotubes with polymerizable functional groups such as oxirane and anhydride groups and then subjecting the surface-modified carbon nanotubes either to a photolithography process or to a heatcuring process.

2. Description of the Related Art

Carbon nanotubes were found from electronmicroscopic observation by Dr. Iijima at Maijo University, Japan in 1991. Since then, carbon nanotubes have received profound studies. Typically, a carbon nanotube is like a hollow cylinder made of a graphite sheet, whose inner diameter ranges from 1 to 20 nm.

Graphite has been known to have a peculiar structure. That is, the covalent bonds between carbon atoms constituting graphite are arranged in an unusual style, so that graphite has a shape of rigid, flat hexagonal sheet. The upper and lower regions of the sheet are filled with dispersed free electrons, which keep translating in a parallel motion with the sheet. The graphite sheet rolls up in a spiral to generate a carbon nanotube, wherein curvatures of graphite sheet are coupled with those of the others. Electric properties of the carbon nanotube are in functional relation with the structure and diameter thereof (*Phys. Rev.* (1992) B46:1804 and *Phys. Rev. Lett.* (1992) 68:1579). Thus, an alteration of either helicity or chirality of the carbon nanotube results in a change of motion of the free electrons. Consequently, the free electrons are allowed to move freely as in a metallic material, or they have to overcome a barrier as in a semiconductive material. In this connection, the range of the barrier varies in concordance with the diameter of the carbon nanotube, and it may be 1 eV in case of the smallest tube. It is amazing that the identical material can have so various electric properties ranging from a conductor to a nonconductor according to its structure and diameter. These special characteristics of carbon nanotubes, including mechanical rigidity, chemical stability, variableness of electric conductivity and elongated hollow cylinder-like shape, makes the carbon nanotube useful for the production of flat-panel display (FPD), transistor, energy storing material, electronic devices of nano-size, and so on.

Recently, a method of arranging carbon nanotubes on a gold substrate was reported by Zhongfan Liu at Beijing University, the People's Republic of China, wherein every end of the carbon nanotube was modified with sulfur (*Langmuir* (2000) 16:3569). Another method was reported by Smalley at Rice University, U.S.A., wherein the method comprises the steps of: forming a self-assembled monolayer of trimethylsilyl groups on a silicon substrate; patterning the monolayer using electron beam; attaching amine groups to the pattern; and attaching carbon nanotubes to the amine groups (*Chemical Physics Letters* (1999) 303:125). However, this method is problematic in that the self-assembled monolayer of trimethylsilyl groups is unstable and susceptible to the circumstances.

Meanwhile, there has been reported a method of producing a polymer matrix composite by blending 10–100 parts by weight of carbon nanotubes with 100 parts by weight polyvinyl alcohol, wherein thermal properties of the composite increased in proportion to the carbon nanotube content ((*Adv. Mater.* (1999) 11:937). However, this method is problematic in that such blending is insufficient to achieve good interface adhesiveness between carbon nanotubes and polyvinyl alcohol, so a surfactant is additionally needed. In this connection, there has been reported an example of enhancing the interface adhesiveness between carbon nanotubes and epoxy resins by the use of a certain surfactant (*Chem. Mater.* (2000) 12:1049).

SUMMARY OF THE INVENTION

The present invention features carbon nanotubes whose surfaces are chemically modified to have oxirane or anhydride groups.

The present invention further features a method of obtaining a patterned film as a result of photocuring of the surface-modified carbon nanotubes.

The present invention further features a method of obtaining a polymerized carbon nanotube composite as a result of heatcuring of the surface-modified carbon nanotubes.

In accordance with one aspect of the present invention, there is provided a method of forming a negative pattern of carbon nanotubes, wherein the method comprises the steps of:

(a) dispersing carbon nanotubes in an organic solvent with one or more photoacid or photobase generator to provide a liquid coating composition, wherein surfaces of the carbon nanotubes are modified with an oxirane group of formula (1) and/or surfaces of the carbon nanotubes are modified with an anhydride group of formula (2), (3), (4), (5), (6) or (7):

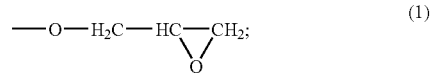

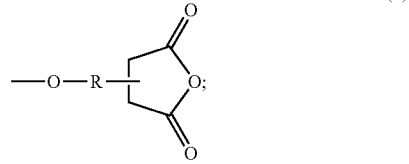

wherein, R is $C_{1-15}$, linear, branched or cyclic alkylene;

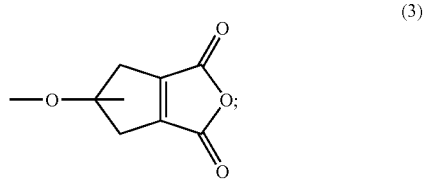

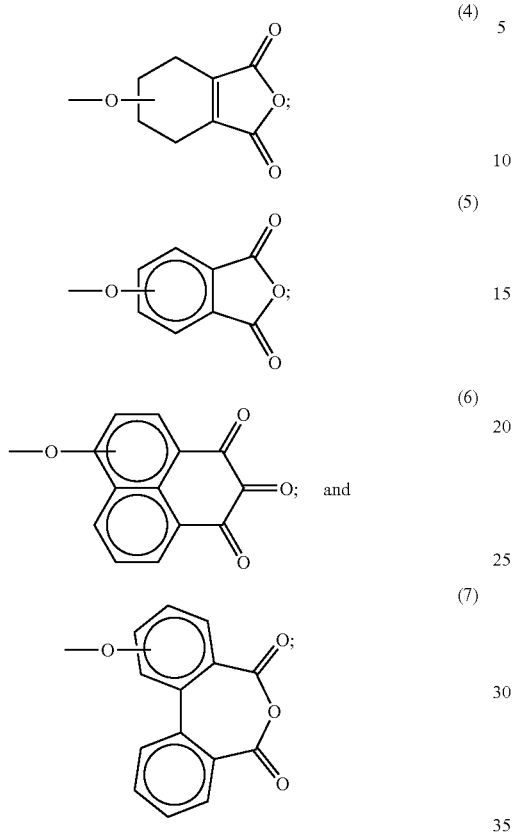

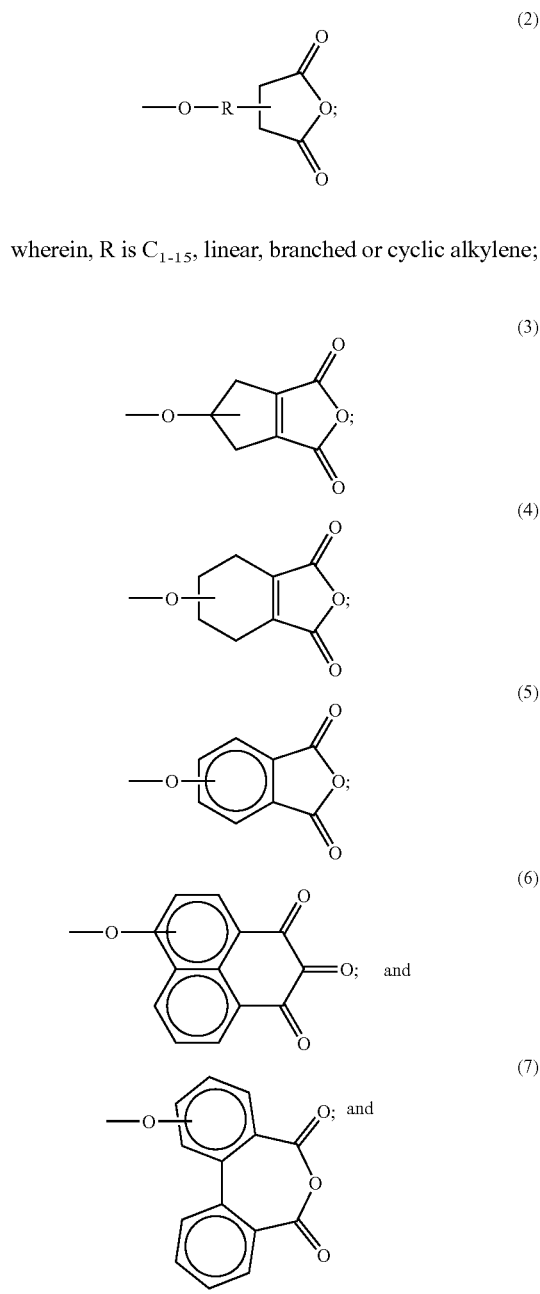

wherein, R is $C_{1-15}$, linear, branched or cyclic alkylene;

(b) applying the liquid coating composition onto a substrate and evaporating the organic solvent by prebaking to deposit a coating film on the substrate;

(c) exposing the coating film to UV light through a photomask having a desired pattern to induce photopolymerization of the surface-modified carbon nanotubes in exposed areas of the coating film; and (d) developing the exposed coating film with an organic developer to remove unexposed areas of the coating film, resulting in a negative pattern of carbon nanotubes.

In accordance with another aspect of the present invention, there is provided a method of producing a polymerized carbon nanotube composite, wherein the method comprises the steps of:

(a) dispersing carbon nanotubes in an organic solvent along with one or more thermal hardener to provide a liquid coating composition, wherein surfaces of the carbon nanotubes are modified with an oxirane group of formula (1) and/or surfaces of the carbon nanotubes are modified with an anhydride group of formula (2), (3), (4), (5), (6) or (7):

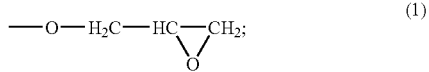

(b) applying the liquid coating composition onto a substrate and heatcuring to provide a polymerized carbon nanotube composite.

In accordance with another aspect of the present invention, there is provided a negative pattern of carbon nanotubes prepared according to the above method.

In accordance with another aspect of the present invention, there is provided a polymerized carbon nanotube composite prepared according to the above method.

All of the above features and other features of the present invention will be successfully achieved from the present invention described in the following.

DETAILED DESCRIPTION OF PREFERRED EMBODIMENTS OF THE INVENTION

The present inventors have succeeded in obtaining insoluble films of carbon nanotubes or interpenetrating polymer networks (IPNs), respectively, by cationic polymerization or heatcuring of carbon nanotubes whose surfaces are modified with oxirane or anhydride groups.

Below is provided detailed description of the inventive surface-modified carbon nanotubes.

As used herein, by "oxirane group" is meant a functional group having the structure of formula (1):

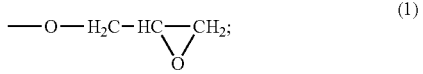
(1)

As used herein, by "anhydride group" is meant a functional group having any structure of formulas (2)–(7):

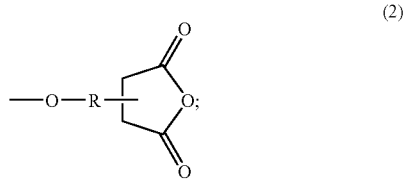
(2)

wherein, R is $C_{1-15}$, linear, branched or cyclic alkylene;

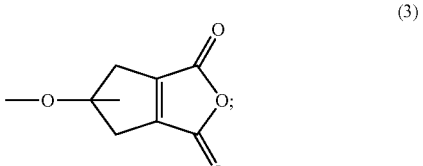
(3)

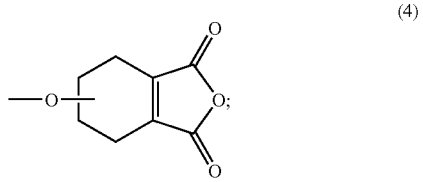
(4)

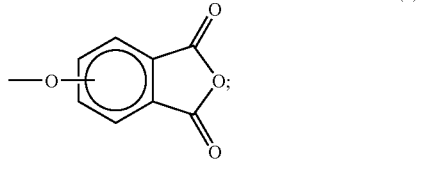
(5)

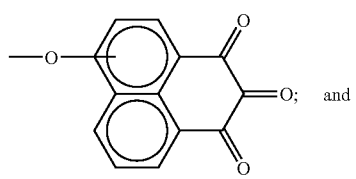
(6) and

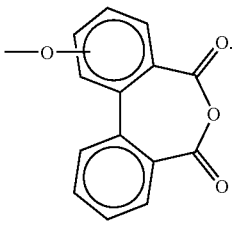
(7)

According to the present invention, carboxylation of carbon nanotube surfaces should precede modification with the oxirane or anhydride groups. The carboxylation can be accomplished according to any of the conventional methods well known in the art, and, for example, according to the following procedure. First, carbon nanotubes are refluxed in a sonicator filled with a mixed acid solution of nitric acid and sulfuric acid (7:3 (v/v)) for 24 hrs. Then, this slurry is filtered through a 0.2 μm polycarbonate filter, and remaining solid matter is recovered and refluxed again in nitric acid at 90° C. for 45 hrs, followed by centrifugation at 12,000 rpm. At the completion of the centrifugation, supernatant is recovered and filtered through a 0.1 μm polycarbonate filter. Remaining solid matter is recovered and completely dried to afford dry carbon nanotubes. The dry carbon nanotubes are dispersed in distilled water or dimethylformaldehyde (DMF), and the dispersion is filtered through a 0.1 μm polycarbonate filter to select carbon nanotubes over a certain size.

Subsequently, the carbon nanotubes thus carboxylated are modified with oxirane or anhydride groups as follows. First, the carboxylated carbon nanotubes are added to an organic solvent such as DMF, 4-hydroxy-4-methyl-2-pentanone, ethylene glycol monoethyl ether and 2-methoxyethanol and evenly dispersed therein by ultrasonification. Thereafter, for the purpose of promoting attack by oxirane or anhydride, the hydroxyl terminal of the carboxyl group on the surface of the carbon nanotube is substituted by chlorine by adding thionyl chloride to the carbon nanotube dispersion and stirring at 60–80° C. for 20–30 hrs. At the completion of the reaction, the reaction mixture is diluted with anhydrous THF and centrifuged. After discarding brown supernatant, remaining precipitate is recovered and rinsed with anhydrous THF several times. The resulting black solid matter is subjected to vacuum drying to afford chlorinated carbon nanotubes. Next, the chlorinated carbon nanotubes are dispersed in an organic solvent (e.g., chloroform and dimethyl formamide) and subjected to a reflux reaction with an oxirane compound (e.g., glycidol) in the presence of a base catalyst (e.g., pyridine) for 30–60 hrs so as to obtain carbon nanotubes modified with oxirane groups. Alternatively, the chlorinated carbon nanotubes, which are dispersed in such an organic solvent as chloroform and dimethyl formamide, are subjected to a reaction with a dimethyl ester derivative having a hydroxyl group at one end thereof to afford carbon nanotubes modified with dimethyl ester groups, which are then converted into dicarboxylic acid through a reaction with water in the presence of sodium hydroxide. A subsequent condensation reaction of the dicarboxylic acid yields carbon nanotubes modified with anhydride groups. At the end of the modification, the carbon nanotubes are rinsed with a solvent such as methanol to wash off the remnant of the reactants. Existence of oxirane or anhydride groups on the surface of the carbon nanotube can easily be examined by Raman spectrum.

The carbon nanotubes used in the present invention are commercially available, and they are conventionally produced by arc discharge method, laser ablation method, high temperature filament plasma chemical vapor deposition method, microwave plasma chemical vapor deposition method, thermochemical vapor deposition method and thermal decomposition method. The commercial carbon nanotubes, however, are certain to be contaminated with carbon-containing by-products, such as amorphous carbon and fullerene ($C_{60}$), as well as transition metal catalysts necessary for growth of tubes, so they should be undergo a certain purifying process. In the present invention, any of the conventional methods of purifying carbon nanotubes can be used, and one of them is exemplified in the following. First, carbon nanotubes are refluxed in 100° C. distilled water for 8–24 hrs, preferably for 12 hrs, and then recovered by filtration. The recovered carbon nanotubes are dried completely and washed with toluene so as to remove the carbon-containing by-products. The resulting soot is heated at 470° C. for 20–30 minutes, preferably for 20 minutes, followed by washing with 6M HCl solution so as to remove the metallic impurities. As a result, pure carbon nanotubes are obtained.

Below is provided detailed description of a method of forming a negative pattern of carbon nanotubes by photocuring the surface-modified carbon nanotubes and a method of producing a polymerized carbon nanotube composite by heatcuring the surface-modified carbon nanotubes.

According to the present invention, a liquid coating composition for photocuring to provide the carbon nanotube negative pattern is prepared by dispersing carbon nanotubes modified with oxirane groups and/or carbon nanotubes modified with anhydride groups in an organic solvent along with one or more photoacid or photobase generators. Alternatively, in case of preparing a liquid coating composition for heatcuring to provide a polymerized carbon nanotube composite, the photoacid or photobase generators are replaced with one or more thermal hardeners.

Photoacid generators (hereinafter, referred to as PAGs) used in the present invention are one or more selected from the group consisting of onium-based PAGs of formulas (8)–(18), ionic PAGs such as diphenylene iodonium with hydroxyl containing aromatic sulfonate of formula (19), hydroxyl aromatic sulfonate diazonaphotoquinone (DNQ) of formula (20) and nonionic PAGs such as nitrobenzylsulfonic acid of formula (21):

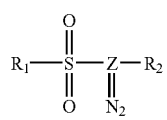

(8)

wherein, each of $R_1$ and $R_2$, independently, is $C_{1-10}$ linear, branched or cyclic alkyl group; and Z is sulfonyl or carbonyl group.

Non-limiting examples of compound of formula (8) include 1-cyclohexylsulfonyl-1-(1,1-dimethylethylsulfonyl)-diazomethane, bis(1,1-dimethylethylsulfonyl)diazomethane, bis(1-methylethylsulfonyl)methane, bis(cyclohexylsulfonyl)-diazomethane, 1-cyclohexylsulfonyl-1-cyclohexylcarbonyl-diazomethane, 1-diazo-1-cyclohexylsulfonyl-3,3'-dimethyl-2-butanone, 1-diazo-1-methylsulfonyl-4-phenyl-2-butanone, 1-diazo-1-(1,1-dimethylethylsulfonyl)-3,3-dimethyl-2-butanone, and 1-acetyl-1-(1-methyletlsulfonyl)diazomethane.

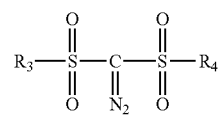

(9)

wherein, each of $R_3$ and $R_4$, independently, is hydrogen atom, halogen atom, $C_{1-10}$ linear, branched or cyclic alkyl group, or $C_{1-12}$ phenylalkyl group and a halogen atom may be substituted for at least one hydrogen atom attached to $R_3$ or $R_4$.

Non-limiting examples of compound of formula (9) include bis(cyclohexylsulfonyl)diazomethane, bis(p-toluenesulfonyl)diazomethane, methylsulfonyl-p-toluenesulfonyl diazomethane, 1-diazo-1-(p-toluenesulfonyl)-3,3-dimethyl-2-butanone, bis(p-chlorobenzenesulfonyl)diazomethane, and cyclohexylsulfonyl-p-toluenesulfonyldiazomethane.

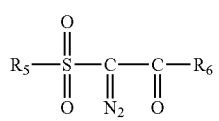

(10)

wherein, each of $R_5$ and $R_6$, independently, is hydrogen atom, halogen atom, $C_{1-10}$ linear, branched or cyclic alkyl group, $C_{1-12}$ phenylalkyl or phenyl group, or tolyl group.

Non-limiting examples of compound of formula (10) include 1-cyclohexylsulfonyl-1-cyclohexylcarbonyl diazomethane, 1-p-toluenesulfonyl-1-cyclohexylcarbonyl diazomethane, 1-diazo-1-(p-toluenesulfonyl)-3,3-dimethyl-2-butanone, 1-diazo-1-benzenesulfonyl-3,3-dimethyl-2-butanone, and 1-diazo-1-(p-toluenesulfonyl)-3-methyl-2-butanone.

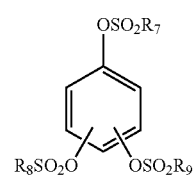

(11)

wherein, each of $R_7$, $R_8$ and $R_9$, independently, is $C_{1-10}$ linear, branched or cyclic alkyl group, or $C_{1-12}$ phenylalkyl, or phenyl group and a halogen atom, a nitro group or thienyl group may be substituted for at least one hydrogen atom attached to one of $R_7$, $R_8$ and $R_9$.

Non-limiting examples of compound of formula (11) include 1,2,3-tris(trifluoromethanesulfonyloxy)benzene, 1,2,3-tris(2,2,2-trifluoroethanesulfonyloxy)benzene, 1,2,3-tris(2-chloroethanesulfonyloxy)benzene, 1,2,3-tris(p-trifluorobenzenesulfonyloxy)benzene, 1,2,3-tris(p-nitro-benzenesulfonyloxy)benzene, 1,2,3-tris(2,3,4,5-pentafluorobenzenesulfonyloxy) benzene, 1,2,3-tris(p-fluorobenzenesulfonyloxy)benzene, 1,2,3-tris (methanesulfonyl-oxy)benzene, 1,2,4-tris(p-trifluoromethyloxy-benzenesulfonyloxy)benzene, 1,2,4-tris(2,2,2-trifluoroethanesulfonyloxy)benzene, 1,2,4-tris(2-thienylsulfonyloxy)benzene, 1,3,5-tris(methanesulfonyl-oxy)benzene, 1,3,5-tris(trifluoromethanesulfonyloxy) benzene, 1,3,5-tris(2,2,2-trifluoroethanesulfonyloxy) benzene, 1,3,5-tris(p-nitrobenzenesulfonyloxy)-benzene, 1,3,5-tris(2,3,4,5,6-pentafluorobenzenesulfonyl-oxy)benzene, 1,3,5-tris(p-fluorobenzenesulfonyloxy)-benzene, and 1,3,5-tris(2-chloroethanesulfonyloxy)benzene.

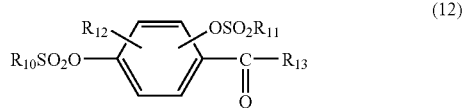

(12)

wherein, each of $R_{10}$ to $R_{13}$, independently, is $C_{1-10}$ linear, branched or cyclic alkyl group, or $C_{1-12}$ phenylalkyl, or phenyl group and a halogen atom, a nitro group or thienyl group may be substituted for at least one hydrogen atom attached to one of $R_{10}$ to $R_{13}$.

Non-limiting examples of compound of formula (12) include 2,3,4-tris(p-fluorobenzenesulfonyloxy)benzophenone, 2,3,4-tris(trifluoromethanesulfonyloxy)benzophenone, 2,3,4-tris(2-chloroethanesulfonyloxy)benzophenone, 2,3,4-tris(p-trifluoromethylbenzenesulfonyloxy)benzophenone, 2,3,4-tris(p-nitrobenzenesulfonyloxy)benzophenone, 2,3,4-tris(p-fluorobenzenesulfonyloxy)acetophenone, 2,3,4-tris(2,3,4,5,6-pentafluorobenzenesulfonyloxy)-acetophenone, 2,3,4-tris(2-nitrobenzenesulfonyloxy)-acetophenone, 2,3,4-tris(2,5-dichlorobenzenesulfonyloxy)acetophenone, 2,3,4-tris(2,3,4-trichlorobenzenesulfonyl-oxy)acetophenone, 2,2',4,4'-tetra(methanesulfonyl-oxy)benzophenone, 2,2',4,4'-tetra(2,2,2-trifluoroethanesulfonyloxy)benzophenone, 2,2',4,4'-tetra(2-chloroethanesulfonyloxy)benzophenone, 2,2',4,4'-tetra(2,5-dichloro-benzenesulfonyloxy)benzophenone, 2,2',4,4'-tetra(2,4,6-trimethylbenzenesulfonyloxy)benzophenone, and 2,2',4,4'-tetra(m-trifluoromethylbenzenesulfonyloxy)benzophenone.

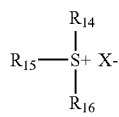

(13)

wherein, each of $R_{14}$, $R_{15}$ and $R_{16}$, independently, is $C_{1-10}$ linear, branched or cyclic alkyl group, or $C_{1-12}$ phenylalkyl, or phenyl group and a halogen atom, a nitro group or thienyl group may be substituted for at least one hydrogen atom attached to one of $R_{14}$, $R_{15}$ and $R_{16}$; and X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$.

Non-limiting examples of compound of formula (13) include triphenylsulfonium trifluoromethanesulfonate, triphenylsulfonium perfluorooctanesulfonate, diphenyl-p-tolylsulfonium perfluorooctanesulfonate, tris(p-tolyl)-sulfonium perfluorooctanesulfonate, tris(p-chlorobenzene)-sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyltolylsulfoniumtrifluoromethanesulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyl-tolylsulfonium 1,3,4-trichlorobenzene-sulfonate, dimethyltolylsulfonium p-toluenesulfonate, diphenyltolylsulfonium 2,5-dichlorobenzenesulfonate, triphenylsulfonium chloride, triphenylsulfonium bromide, triphenylsulfonium tetrafluoroborate, triphenylsulfonium hexafluoroantimonate, triphenylsulfonium hexafluorophosphate, and triphenylsulfonium hexafluoroarsenate.

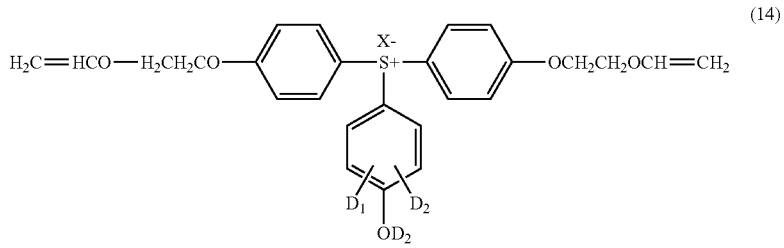

(14)

wherein, X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$; and each of $D_1$ and $D_2$, independently, is hydrogen atom, $C_{1-6}$ alkyl group, or vinyloxymethyl group.

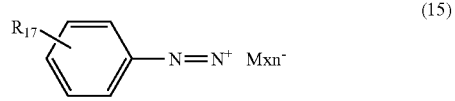

(15)

wherein, $R_{17}$ is $C_{1-10}$ alkyl group; and $MXn^-$ is $BF_4^-$, $PF_6^-$, $AsF_6^-$ or $SbF_6^-$.

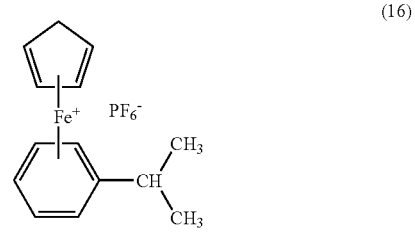

(16)

(17)

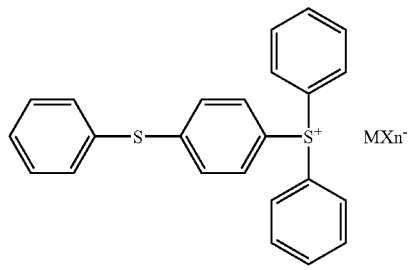

wherein, MXn⁻ is $PF_6^-$ or $SbF_6^-$.

(18)

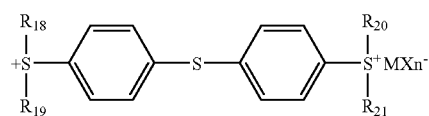

wherein, each of $R_{18}$ to $R_{21}$, independently, is $C_{1-10}$ alkyl group; and MXn⁻ is $PF_6^-$ or $SbF_6^-$.

(19)

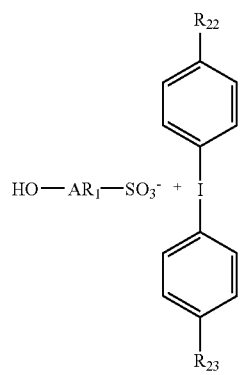

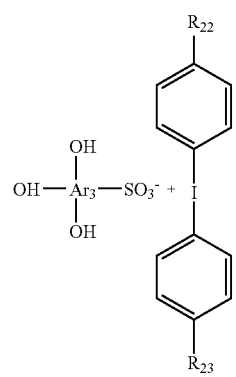

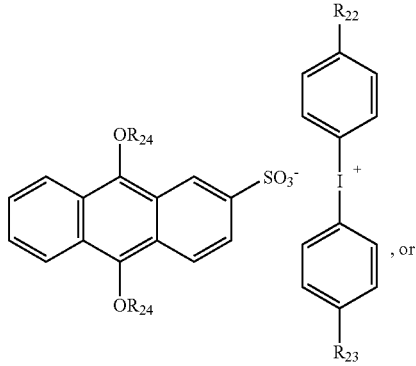

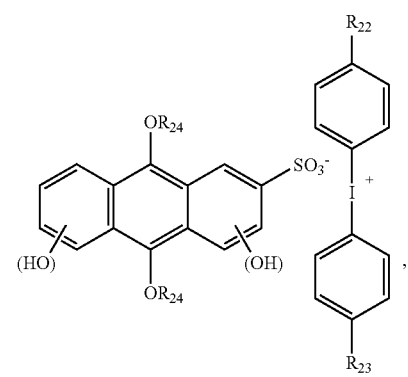

wherein, each of $R_{22}$, $R_{23}$ and $R_{24}$, independently, is $C_{1-12}$ alkyl or alkoxy, or hydroxyl group; and each of $Ar_1$, $Ar_2$ and $Ar_3$, independently, is phenyl, naphthalene, or anthracene group.

(20)

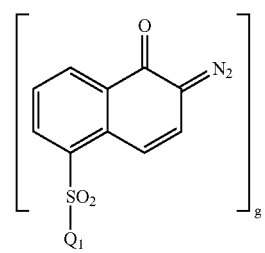

or

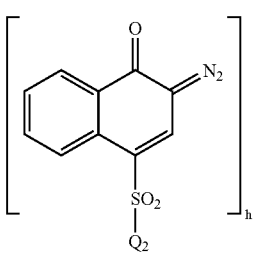

wherein, each of $Q_1$ and $Q_2$, independently, is $C_{1-12}$ alkyl or aryl group; and each of g and h, independently, is an integer above 1.

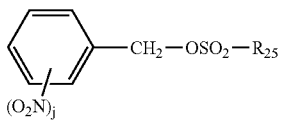

wherein, $R_{25}$ is $C_{1-12}$ alkyl or aryl group, which may or may not contain at least one heteroatom; and j is an integer from 1 to 3.

In addition to such photoacid generators as described above, any polymeric (Mw=500–1,000,000) photoacid generator can be used in the present invention as well, which can generate an acid through a photoreaction because it has a sulfonium salt or an iodonium salt at backbone or side chain thereof or it has an organic, photoacid generating group at side chain thereof.

Alternatively, a photobase generator can be used in substitution for the photoacid generator. Photobase generator used in the present invention has the structure of formula (22):

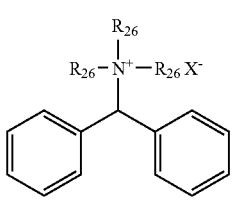

wherein, each of $R_{26}$, independently, is methyl, ethyl, propyl or butyl group; and X is Br or I.

Preferable compounds of formula (22) can be exemplified by, but are not limited to trimethylbenzhydrylammonium iodide, and trimethylbenzhydrylammonium triflate, and trimethylfluorenylammonium iodide.

According to the present invention, for the purpose of securing photoreactivity of those photoacid or photobase generators throughout a broad wave length range covering UV light, one or more photo intensifiers can optionally be used, such as 2-ethyl-9,10-dimethoxyanthracene, 9,10-dichloroanthracene, 1-chloroanthracene, 2-methylanthracene, 9-methylanthracene, 2-t-butylanthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, 2-ethyl-9,10-dimethoxyanthracene, N-methylphenothiazine, and isopropyl-thioxanthone.

On the other hand, non-limiting examples of thermal hardener include amines, anhydrides, imidazoles, arylphenols, carboxylic acids such as polymethacrylic acid, polyamido-amines, polyamides, boron trifluoride, tris(β-methylglycidyl)isocyanurate, bis(β-methylglycidyl)-terephthalate, and p-phenolsulfonic acid.

Amines can be classified into non-aromatic and aromatic. Preferable examples of non-aromatic thermal hardener include 1,3-diaminopropane, 1,4-diaminobutane, ethylenediamine, diethylaminopropylamine, dimethylamine, trimethylhexamethylenediamine, diethylene triamine, triethylene tetramine, diethylamino propylamine, menthane diamine, 1,1-dimethylhydrazine, N-(3-aminopropyl)1,3-propanediamine, spermidine, spermine, 3,3'-diamino-N-methyldipropylamine, cyclopropylamine, cyclopentylamine, cyclohexylamine, cyclopentylamine, cyclooctylamine, cyclododecylamine, exo-2-aminorbornane, 1-adamantanamine, 4,4'-methylenbis(cyclohexylamine), isophorone diamine, ethanolamine, 2-hydroxyethylhydrazine, 3-amino-1-propanol, 5-amino-1-pentanol, serinol, 2-(2-aminoethylamino)-ethanol, 3-pyrrolidinol, piperidine, hexamethyleneimine, piperazine, N-aminoethylpiperazine, and 1,4,7-triazacyclononane. Preferable examples of aromatic thermal hardener include benzyl dimethyl amine, aniline, 4,4'-dimethyl aniline, diphenylamine, N-phenylbenzylamine, hexamethylene diamine, meta phenylene diamine, 2-methyl pentadimethylenediamine, 2-methyl hexamethylene diamine, 3-methyl hexamethylene diamine, 2,5-dimethyl hexamethylene diamine, 2,2-dimethylpentamethylene diamine, 5-methylnonane diamine, dodecadimethylene diamine, 2,2,7,7-tetramethyl octamethylene diamine, metaxylylene diamine, paraxylene diamine, 2-aminophenol, 3-fluoroaniline, 4,4'-ethylenedianiline, alkylaniline, 4-cyclohexylaniline, 3,3-methylenedianiline, 4,4'-methylenedianiline, 4-chloroaniline, 4-butoxyanline, 4-pentyloxyaniline, 4-hexyloxyaniline, 4,4'-oxydianline, 4''',4'''-(hexafluoroisopropylidene)-bis(4-phenoxyaniline), N,N-diglycidyl-4-glycidyloxyaniline, 4-aminophenol, 4,4'-thiodianiline, 4-aminophenethyl alcohol, 2,2-dimethylaniline, 4-fluoro-2-(trifluoromethyl)aniline, 4-fluoro-3-(trifluoromethyl)aniline, 5,5'-(hexafluoroisopropylidene)-di-O-toluidine, 4'-aminobenzo-15-crown-5,1,4-phenylenediamine, 2-aminobiphenyl, 4,4'-methylenbis(N,N-diglycidylaniline), 4,4'-methylenbis(N,N-diglycidylaniline), 4,4'-(hexafluoroisopropylidene)-dianiline, 4-phenoxyaniline, 3,3'-dimethoxybenidine, 2-aminonaphthalene, 2,3-diamino-napthalene, 1-8-diaminonaphthalene, 1-aminoanthracene, 2-aminoanthracene, 9-aminophenanthrene, 9,10-diaminophenanthrene, 3-aminofluoroanthene, 1-aminopyrene, 6-aminochrysene, phenylhydrazine, 1,2-diphenylhydrazine, 4-(trifluoromethyl)-phenylhydrazine, 2,3,5,6-tetrafluoro-phenylhydrazine, dibenzylamine, N,N'-dibenzylethylenediamine, N-benzyl-2-phenethylamine, 1-aminoindan, 1,2,3,4-tetrahydro-1-naphthylamine, 2-methylbenzylamine, 3,5-bis(trifluoromethyl) benzylamine, 3,4,5-trimethoxybenzylamine, indoline, 3-amino-1,2,4-triazine, 2-chloro-4,6-diamino-1,3,5-triazine, 2,4-diamino-6-methyl-1,3,5-triazine, 2,4,6-triaminopyrimidine, 2,4,5,6-tetraminopyrimidine sulfate, diamino diphenyl sulfone, tris(dimethylaminomethyl)phenol, and dimethyl aminomethyl phenol.

Preferable examples of anhydride-based thermal hardener include succinic anhydride, pentenyl succinic anhydride, hexenyl succinic anhydride, octenyl succinic anhydride, dodecenyl succinic anhydride, octadecenyl succinic anhydride, polyisobutenyl succinic anhydride, maleic anhydride, glutaric anhydride, cis-1,2-cyclohexanedicarbocylic anydride, phenylmaleic anhydride, phthalic anhydride, 4,4'-(hexafluoroisopropylidene)-diphthalic anhydride, 4-methylphthalic anhydride, 3,6-difluorophthalic anhydride, 3,6-dichlorophthalic anhydride, 4,5-dichlorophthalic anhydride, tetrafluorophthalic anhydride, tetrachlorophthalic anhydride, tetrabromophthalic anhydride, 3-hydroxyphthalic anhydride, 1,2,4-benzenetricarboxylic anhydride, 3-nitrophthalic anhydride, 1,2,4,5-benznetetracarboxylic dianhydride, diphenic anhydride, 1,8-naphthalic anhydride, 4-chloro-1,8-naphthalic anhydride, 4-bromo-1,8-naphthalic anhydride, 4-amino-1,8-naphthalic anhydride, 1,4,5,8-naphthalene-tetracarboxylic dianhydride, and 3,4,9,10-perylene-tetracarboxylic dianhydride.

Preferable examples of imidazole-based thermal hardener include imidazole, 1-methylimidazole, 2-methylimidazole, 4-methylimidazole, 2-ethylimidazole, 2-propylimidazole, 2-isopropylimidazole, 1-butylimidazole, 2-undecylimidazole, 1,2-dimethylimidazole, 2-ethyl-4-methylimidazole, 1-decyl-2-methylimidazole, 1,5-dicyclo-hexylimidazole, 2,2'-bis(4,5-dimethylimidazole), 1-vinyl-imidazole, 1-allylimidazole, 5-choloro-1-methylimidazole, 5-chloro-1-ethyl-2-methylimidazole, 4,5-dichloroimidazole, 2,4,5-tribromoimidazole, 2-mercaptoimidazole, 2-mercapto-1-methylimidazole, 1-(3-aminopropyl)imidazole, 1-phenylimidazole, 2-phenylimidazole, 4-phenylimidazole, 4-(imidazol-1-yl)phenol, 1-benzylimidazole, 4-methyl-2-phenylimidazole, 1-benzyl-2-methylimidazole, 4,5-diphenyl-imidazole, 2,4,5-triphenylimidazole, 1-(2,3,5,6-tetrafluorophenyl)imidazole, 4,5-diphenyl-2-imiidazolethiol, histamine, 2-nitroimidazole, 4-nitroimidazole, 2-methyl-5-nitroimidazole, 2-imidazolecarboxaldehyde, 4-methyl-5-imidazolecarboxaldehyde, 1,1'-carbonylimidazole, 1,1'-oxalyldiimidazole, 1,1'-carbonylbis(2-methylimidazole), methyl-imidazolecarboxylate, 1-(tert-butoxycarbonyl)imidazole, 1-trans-cinnamoylimidazole, 1-(2-naphthoyl)imidazole, and ethyl 4-methyl-5-imidazole-carboxylate.

Preferable examples of arylphenol-based thermal hardener include m-cresol, o-cresol, p-cresol, 2,4-xylenol, 2,5-xylenol, 3,4-xylenol, 3,5-xylenol, thymol, catechol, and pyrogallol.

Preferable examples of carboxylic acid-based thermal hardener include acetic acid, formic acid, propionic acid, butyric acid, isobutyric acid, valeric acid, isovaleric acid, pivalic acid, and hexanoic acid.

Whether for photocuring or for heatcuring, a liquid coating composition is preferably prepared by the use of one or more solvents selected from the group consisting of DMF, 4-hydroxy-4-methyl-2-pentanone, ethylene glycol monoethyl ether, 2-methoxyethanol, methoxypropylacetate, ethyl-3-ethoxypropionate, and cyclohexanone, considering mixability, dispersibility and coatability.

Preferably, final concentration of carbon nanotubes in the liquid coating composition is 3–95 wt %. For photocuring, in view of UV resistance of the liquid coating composition, photoacid or photobase generator is preferably added in an amount of 0.1–15 parts by weight to 100 parts by weight of the carbon nanotubes. Where a photo intensifier is added to the liquid coating composition as described above, the photo intensifier is preferably added in an amount of 0.3–2 parts by weight to 100 parts by weight of the carbon nanotubes. On the other hand, for heatcuring, a thermal hardener is preferably added in an amount of 1–35 parts by weight to 100 parts by weight of the carbon nanotubes, considering port life of the liquid coating composition.

According to the present invention, for the purpose of enhancing toughness of a final coating film, one or more coupling agents can optionally be added to the liquid coating composition, such as aminopropyltriethoxysilane, phenylaminopropyltrimethoxysilane, ureidopropyltriethoxysilane, glycidoxypropyltrimethoxysilane, isocyanatopropyltriethoxysilane, isopropyltriisostearoyltitanate, and acetoalkoxyaluminium diisopropylate, so that coupling agent is added in an amount of 0.1–10 parts to 100 parts by weight of the carbon nanotubes.

Further, to the liquid coating composition may be added 1–95 parts by weight, preferably 3–60 parts by weight of oxirane group-containing and/or anhydride group-containing monomer, oligomer or polymer based on 100 parts by weight of the carbon nanotubes, regardless of the type of the functional groups pending to the surface-modified carbon nanotubes. They are to participate in crosslinking reactions with the surface-modified carbon nanotubes in the course of photopolymerization or thermal polymerization, to give evenness and other functionalities to the resulting coating film. Oxirane group-containing resins suitable for this purpose can be exemplified by epoxyacrylate derivatives, commercial epoxy resins having glycidyl ether groups, and so on.

Moreover, to the liquid coating composition may be added 1–30 parts by weight of polymer binder based on 100 parts by weight of the carbon nanotubes, wherein the polymer binder is one or more selected from the group consisting of polyester, polycarbonate, polyvinylalcohol, polyvinylbutylal, polyacetal, polyarylate, polyamide, polyamideimide, polyetherimide, polyphenyleneether, polyphenylenesulfide, polyethersulfone, polyetherketone, polyphthalamide, polyethernitrile, polybenzimidazole, polycarbodiimide, polysiloxane, polymethylmethacrylate, polymethacrylamide, nitrile rubber, acryl rubber, polyethylenetetrafluoride, epoxy resin, phenol resin, melamine resin, urea resin, polybutene, polypentene, ethylene-propylene copolymer, ethylene-butene-diene copolymer, polybutadiene, polyisoprene, ethylene-propylene-diene copolymer, butyl rubber, polymethylpentene, polystyrene, styrene-butadiene copolymer, hydrogenated styrene-butadiene copolymer, hydrogenated polyisoprene, and hydrogenated polybutadiene.

Besides, other additives including dyes, fillers, flame-retarding agents and wetting agents may be used in accordance with uses of the final patterned film or polymerized composite of the carbon nanotubes.

The liquid coating composition is then applied evenly to the surface of a substrate. The materials of the substrate are not particularly limited, and glass substrate, silicon substrate or plastic substrate can be used according to the purpose. Applying of the liquid coating composition can be accomplished by any of the conventional coating methods well known in the art, such as spin-coating, dip-coating, spray-coating, flow-coating and screen-printing, while spin-coating is most preferred in light of convenience and film evenness. For spin coating, the spin rate is determined between 500 and 3,500 rpm, depending on viscosity of the liquid coating composition and desired film thickness.

For making a negative pattern by photocuring, the application of the liquid coating composition is followed by prebaking for evaporating solvent at 80–120° C., preferably at 100° C. for 1–2 minutes, resulting in deposition of a coating film on the substrate. Subsequently, the coating film is exposed to UV light through a photomask having a desired pattern and then, if necessary, subjected to post curing at 70–120° C., preferably at 100° C. for 1–3 minutes. Preferably, the exposure dose is controlled to be between 100–800 mJ/cm$^2$. Upon the exposure, at exposed areas, acid or base derived from the photoacid or photobase generators elicits cationic polymerization of the surface modified carbon nanotubes, thereby crosslinking between oxirane groups or anhydride groups pending to the surfaces thereof is accomplished. Consequently, the exposed areas of the coating film become insoluble, so they are hardly dissolved in any developer used in the following developing step as compared with unexposed areas. This solubility difference between exposed areas and unexposed areas allows only the exposed areas to remain on the substrate after developing to afford a desired negative pattern.

For the developing step, the developer is not particularly limited and any of the organic solvents in common use in the field of photolithography can be used, while DMF, 4-hydroxy-4-methyl-2-pentanone, ethylene glycol monoethyl ether and 2-methoxyethanol are preferred considering stability and evenness of the final patterned film.

Alternatively, for making a polymerized carbon nanotube composite by heatcuring, the substrate coated with the liquid coating composition is either left at room temperature for 24 hrs or more or heat treated at 100–150° C. for 15–40 minutes.

The present invention can be more clearly understood with reference to the following examples. It should be understood that the following examples are not intended to restrict the scope of the present invention in any manner.

PRODUCTION EXAMPLE 1

Purification of Carbon Nanotubes

In a 500 ml flask equipped with a reflux tube, 100 mg of carbon nanotubes (ILJIN CNT AP-Grade, Iljin Nanotech Co., Ltd., Korea) was refluxed with 50 ml of distilled water at 100° C. for 12 hrs. After recovering by filtration, the carbon nanotubes were dried at 60° C. for 12 hrs and washed with toluene so as to remove residual fullerene. Then, the remaining soot was collected and heated at 470° C. for 20 minutes, followed by washing with plenty of 6M HCl solution to afford pure carbon nanotubes without metallic impurities.

PRODUCTION EXAMPLE 2

Surface Modification of the Carbon Nanotubes with Carboxyl Groups

In a sonicator filled with a mixed acid solution of nitric acid and sulfuric acid (7:3 (v/v)), the pure carbon nanotubes obtained from the Production Example 1 were refluxed for 24 hrs. After recovering by filtration through a 0.2 μm polycarbonate filter, the carbon nanotubes were refluxed again in nitric acid at 90° C. for 45 hrs. Subsequently, the slurry was centrifuged at 12,000 rpm and the resulting supernatant was filtered through a 0.1 μm polycarbonate filter. Carbon nanotubes recovered from the filtration were dried at 60° C. for 12 hrs and dispersed in DMF, followed by filtration through a 0.1 μm polycarbonate filter for size sorting.

PRODUCTION EXAMPLE 3

Surface Modification of the Carbon Nanotubes with Acetylchloride Groups

In a flame-dried, 2-neck Schlenk flask under a nitrogen atmosphere, 0.03 g of the carboxylated carbon nanotubes obtained from the Production Example 2 was homogeneously dispersed in 20 ml of DMF by ultrasonification for 1 hr. To the dispersion was added 20 ml of thionylchloride and the reaction mixture was stirred at 70° C. for 24 hrs. At the completion of the reaction, the reaction mixture was diluted with anhydrous THF and centrifuged. The resulting brown supernatant was discarded and remaining pellet was repetitively washed with anhydrous THF three times. Black solid matter thus purified was subjected to vacuum drying at room temperature to afford acetylchlorinated carbon nanotubes.

PRODUCTION EXAMPLE 4

Surface Modification of the Carbon Nanotubes with Oxirane Groups 40 mg of the acetylchlorinated carbon nanotubes obtained from the Production Example 3 was homogeneously dispersed in 20 ml of chloroform by ultrasonification for 30 minutes. To the dispersion were sequentially added 4 ml of pyridine and 1 ml of glycidol. The reaction mixture was then stirred for 48 hrs with refluxing. At the completion of the reaction, the reaction mixture was washed with methanol several times so as to remove unreacted glycidol. The resulting black solid matter was subjected to vacuum drying at room temperature to afford carbon nanotubes modified with glycidylether groups.

PRODUCTION EXAMPLE 5

Surface Modification of the Carbon Nanotubes with Anhydride Groups 40 mg of the acetylchlorinated carbon nanotubes obtained from the Production Example 3 was homogeneously dispersed in 2 ml of dimethylformamide by ultrasonification for 30 minutes. To the dispersion were sequentially added 10 ml of pyridine and 2 g of 4-hydroxyphthalic acid dimethylester. The reaction mixture was then stirred at 70° C. for 18 hrs. At the completion of the reaction, the reaction mixture was washed with deionized water several times. To the resulting black solid matter were sequentially added 20 ml of acetone and 0.2 g of sodium hydroxide dissolved in 10 ml of deionized water, followed by stirring at 60° C. for 18 hrs. At the completion of the reaction, the reaction mixture was sequentially washed with watery HCl solution, deionized water and ethylacetate and then subjected to vacuum drying at room temperature. The resulting solid matter was reacted with 5 ml of acetic acid and 5 ml of acetic anhydride at 125° C. for 8 hrs, followed by repetitive washing with methanol. The solid matter thus purified was subjected to vacuum drying at room temperature to afford carbon nanotubes modified with anhydride groups.

EXAMPLE 1

Formation of Negative Pattern (1) Using the Surface-modified Carbon Nanotubes

A liquid coating composition having the following composition was prepared using the carbon nanotubes modified with oxirane groups obtained from the Production Example 4:

| | |
|---|---|
| Surface-modified carbon nanotubes from Production Example 4 | 0.1 g |
| Photoacid generator (triphenylsulfonium pentafluoroarsenate) | 0.001 g |
| Solvent (DMF) | 3.0 g |

After ultrasonification for 1 hr for mixing the ingredients well, the liquid coating composition was applied to a silicon wafer by spin coating at 300 rpm, followed by drying at 100° C. for 1 min to evaporate solvent. The resulting coating film was masked with a photomask of a desired pattern and then exposed to UV light at an exposure dose of 600 mJ/cm$^2$. Subsequently, the exposed film was subjected to post curing at 100° C. for 2 minutes and developed with DMF for 20 seconds to afford a negative pattern line 50 μm long.

EXAMPLE 2

Formation of Negative Pattern (2) Using the Surface-modified Carbon Nanotubes

A liquid coating composition having the following composition was prepared using the carbon nanotubes modified with oxirane groups obtained from the Production Example 4:

| | |
|---|---|
| Surface-modified carbon nanotubes from Production Example 4 | 0.1 g |
| Photoacid generator (triphenylsulfonium trifluoromethanesulfonate) | 0.0005 g |
| Photoacid generator (1-diazo-1-benzenesulfonyl-3,3-dimethyl-2-butanone) | 0.0005 g |
| Solvent (DMF) | 2.0 g |
| Solvent (methoxypropylacetate) | 1.0 g |

After ultrasonification for 1 hr for mixing the ingredients well, the liquid coating composition was applied to a silicon wafer by spin coating at 500 rpm, followed by drying at 100° C. for 1 minute to evaporate solvent. The resulting coating film was masked with a photomask of a desired pattern and then exposed to UV light at an exposure dose of 600 mJ/cm². Subsequently, the exposed film was subjected to post curing at 100° C. for 2 minutes and developed with DMF for 20 seconds to afford a negative pattern line 50 μm long.

EXAMPLE 3

Formation of Negative Pattern (3) Using the Surface-modified Carbon Nanotubes

A liquid coating composition having the following composition was prepared using the carbon nanotubes modified with oxirane groups obtained from the Production Example 4:

| | |
|---|---|
| Surface-modified carbon nanotubes from Production Example 4 | 0.01 g |
| Polymer binder (polystyrene: Mw = 5,000) | 0.15 g |
| Photoacid generator (triphenylsulfonium trifluoromethanesulfonate) | 0.0005 g |
| Photoacid generator (1-diazo-1-benzenesulfonyl-3,3-dimethyl-2-butanone) | 0.0005 g |
| Solvent (DMF) | 1.5 g |
| Solvent (methoxypropylacetate) | 1.0 g |
| Solvent (toluene) | 0.5 g |

After ultrasonification for 1 hr for mixing the ingredients well, the liquid coating composition was applied to a silicon wafer by spin coating at 500 rpm, followed by drying at 100° C. for 1 minute to evaporate solvent. The resulting coating film was masked with a photomask of a desired pattern and then exposed to UV light at an exposure dose of 600 mJ/cm². Subsequently, the exposed film was subjected to post curing at 100° C. for 2 minutes and developed with DMF for 20 seconds to afford a negative pattern line 40 μm long.

EXAMPLE 4

Formation of Negative Pattern (4) Using the Surface-modified Carbon Nanotubes

A liquid coating composition having the following composition was prepared using the carbon nanotubes modified with oxirane groups obtained from the Production Example 4:

| | |
|---|---|
| Surface-modified carbon nanotubes from Production Example 4 | 0.01 g |
| Polymer binder (polyvinylalcohol: Mw = 6,000, 80% hydrolyzed) | 0.15 g |
| Photobase generator (trimethylbenzhydrylammonium triflate) | 0.001 g |
| Solvent (DMF) | 1.5 g |
| Solvent (methoxypropylacetate) | 1.0 g |

After ultrasonification for 1 hr for mixing the ingredients well, the liquid coating composition was applied to a silicon wafer by spin coating at 400 rpm, followed by drying at 100° C. for 1 minute to evaporate solvent. The resulting coating film was masked with a photomask of a desired pattern and then exposed to UV light at an exposure dose of 600 mJ/cm². Subsequently, the exposed film was subjected to post curing at 100° C. for 2 minutes and developed with DMF for 20 seconds to afford a negative pattern line 50 μm long.

EXAMPLE 5

Formation of Negative Pattern (5) Using the Surface-modified Carbon Nanotubes

A liquid coating composition having the following composition was prepared using the carbon nanotubes modified with anhydride groups obtained from the Production Example 5:

| | |
|---|---|
| Surface-modified carbon nanotubes from Production Example 5 | 0.01 g |
| Polymer binder (polystyrene: Mw = 5,000) | 0.15 g |
| Photoacid generator (triphenylsulfonium trifluoromethanesulfonate) | 0.0005 g |
| Photoacid generator (1-diazo-1-benzenesulfonyl-3,3-dimethyl-2-butanone) | 0.0005 g |
| Solvent (DMF) | 1.5 g |
| Solvent (methoxypropylacetate) | 1.0 g |

After ultrasonification for 1 hr for mixing the ingredients well, the liquid coating composition was applied to a silicon wafer by spin coating at 500 rpm, followed by drying at 100° C. for 1 minute to evaporate solvent. The resulting coating film was masked with a photomask of a desired pattern and then exposed to UV light at an exposure dose of 400 mJ/cm². Subsequently, the exposed film was subjected to post curing at 100° C. for 2 minutes and developed with DMF for 20 seconds to afford a negative pattern line 60 μm long.

EXAMPLE 6

Formation of Negative Pattern (6) Using the Surface-modified Carbon Nanotubes

A liquid coating composition having the following composition was prepared using the carbon nanotubes modified with anhydride groups obtained from the Production Example 5:

| | |
|---|---|
| Surface-modified carbon nanotubes from Production Example 5 | 0.01 g |
| Polymer binder (polystyrene: Mw = 5,000) | 0.15 g |
| Photoacid generator (2,2',4,4'-tetra (2,2,2-trifluoroethanesulfonyloxy) benzophenone) | 0.001 g |
| Photo intensifier (isopropylthioxanthone) | 0.0002 g |
| Solvent (DMF) | 1.5 g |
| Solvent (methoxypropylacetate) | 1.0 g |

After ultrasonification for 1 hr for mixing the ingredients well, the liquid coating composition was applied to a silicon wafer by spin coating at 400 rpm, followed by drying at 100° C. for 1 minute to evaporate solvent. The resulting coating film was masked with a photomask of a desired pattern and then exposed to UV light at an exposure dose of 400 mJ/cm$^2$. Subsequently, the exposed film was subjected to post curing at 100° C. for 2 minutes and developed with DMF for 20 seconds to afford a negative pattern line 70 μm long.

EXAMPLE 7

Formation of Negative Pattern (7) Using the Surface-modified Carbon Nanotubes

A liquid coating composition having the following composition was prepared using both the carbon nanotubes modified with oxirane groups obtained from the Production Example 4 and the carbon nanotubes modified with anhydride groups obtained from the Production Example 5:

| | |
|---|---|
| Surface-modified carbon nanotubes from Production Example 4 | 0.01 g |
| Surface-modified carbon nanotubes from Production Example 5 | 0.01 g |
| Polymer binder(polyvinylalcohol: Mw = 6,000, 80% hydrolyzed) | 0.3 g |
| Photoacid generator (1,2,3-tris (p-fluorobenzenesulfonyloxy) benzene) | 0.001 g |
| Solvent (DNF) | 2.5 g |
| Solvent (methoxypropylacetate) | 1.0 g |

After ultrasonification for 1 hr for mixing the ingredients well, the liquid coating composition was applied to a silicon wafer by spin coating at 500 rpm, followed by drying at 100° C. for 1 minute to evaporate solvent. The resulting coating film was masked with a photomask of a desired pattern and then exposed to UV light at an exposure dose of 500 mJ/cm$^2$. Subsequently, the exposed film was subjected to post curing at 100° C. for 2 minutes and developed with DMF for 20 seconds to afford a negative pattern line 60 μm long.

EXAMPLE 8

Production of Carbon Nanotube Composite (1) Using the Surface-modified Carbon Nanotubes A liquid coating composition having the following composition was prepared using the carbon nanotubes modified with oxirane groups obtained from the Production Example 4:

| | |
|---|---|
| Surface-modified carbon nanotubes from Production Example 4 | 0.01 g |
| Polymer binder (polystyrene: Mw = 5,000) | 1.0 g |
| Hardener (ethylenediamine) | 0.002 g |
| Solvent (toluene) | 9.0 g |
| Solvent (DMF) | 1.0 g |

After ultrasonification for 1 hr for mixing the ingredients well, the liquid coating composition was applied to a glass culture dish (100 mm in diameter and 10 mm in height) for film casting. The coated dish was kept at 80° C. for 3 days to evaporate solvent. As a result, a test piece of carbon nanotube composite 0.4 mm thick was obtained, and mechanical properties thereof are as shown in Table 1 below.

EXAMPLE 9

Production of Carbon Nanotube Composite (2) Using the Surface-modified Carbon Nanotubes The procedure of Example 9 was performed according to the same manner as in Example 8 except that composition of the liquid coating composition was changed as follows:

| | |
|---|---|
| Surface-modified carbon nanotubes from Production Example 4 | 0.02 g |
| Polymer binder (polystyrene: Mw = 5,000) | 1.0 g |
| Hardener (ethylenediamine) | 0.002 g |
| Solvent (toluene) | 9.0 g |
| Solvent (DMF) | 10 g |

Mechanical properties of the resulting test piece are as shown in Table 1 below.

EXAMPLE 10

Production of Carbon Nanotube Composite (3) Using the Surface-modified Carbon Nanotubes The procedure of Example 10 was performed according to the same manner as in Example 8 except that composition of the liquid coating composition was changed as follows:

| | |
|---|---|
| Surface-modified carbon nanotubes from Production Example 4 | 0.05 g |
| Polymer binder (polystyrene: Mw = 5,000) | 1.0 g |
| Hardener (ethylenediamine) | 0.002 g |
| Solvent (toluene) | 9.0 g |
| Solvent (DMF) | 1.0 g |

Mechanical properties of the resulting test piece are as shown in Table 1 below.

COMPARATIVE EXAMPLE 1

Production of Carbon Nanotube Composite (4) Using the Surface-modified Carbon Nanotubes The procedure of Comparative Example 1 was performed according to the same manner as in Example 8 except that composition of the liquid coating composition was changed as follows:

| | |
|---|---|
| Surface-modified carbon nanotubes from Production Example 2 | 0.01 g |
| Polymer binder(polystyrene: Mw = 5,000) | 1.0 g |
| Hardener(ethylenediamine) | 0.002 g |
| Solvent(toluene) | 9.0 g |
| Solvent(DMF) | 1.0 g |

Mechanical properties of the resulting test piece are as shown in Table 1 below.

COMPARATIVE EXAMPLE 2

Production of Carbon Nanotube Composite (5) Using the Surface-modified Carbon Nanotubes The procedure of Comparative Example 2 was performed according to the same manner as in Example 8 except that composition of the liquid coating composition was changed as follows:

| Surface-modified carbon nanotubes from Production Example 2 | 0.02 g |
|---|---|
| Polymer binder(polystyrene: Mw = 5,000) | 1.0 g |
| Hardener(ethylenediamine) | 0.002 g |
| Solvent(toluene) | 9.0 g |
| Solvent(DMF) | 1.0 g |

Mechanical properties of the resulting test piece are as shown in Table 1 below.

COMPARATIVE EXAMPLE 3

Production of Carbon Nanotube Composite (6) Using the Surface-modified Carbon Nanotubes The procedure of Comparative Example 3 was performed according to the same manner as in Example 8 except that composition of the liquid coating composition was changed as follows:

| Surface-modified carbon nanotubes from Production Example 2 | 0.05 g |
|---|---|
| Polymer binder(polystyrene: Mw = 5,000) | 1.0 g |
| Hardener(ethylenediamine) | 0.002 g |
| Solvent(toluene) | 9.0 g |
| Solvent(DMF) | 1.0 g |

Mechanical properties of the resulting test piece are as shown in Table 1 below.

TABLE 1

Mechanical properties of carbon nanotube composites

| # | *Elastic modulus (MPa) | **Tensile strength (MPa) |
|---|---|---|
| Example 8 | 2300 ± 110 | 25.3 ± 1.5 |
| Example 9 | 2900 ± 120 | 28.3 ± 1.2 |
| Example 10 | 3700 ± 150 | 32.5 ± 1.7 |
| Comparative Example 1 | 2000 ± 250 | 22.5 ± 2.3 |
| Comparative Example 2 | 2500 ± 205 | 24.7 ± 2.1 |
| Comparative Example 3 | 3200 ± 210 | 27.8 ± 2.5 |
| Blank Polystyrene | 1480 ± 150 | 18.5 ± 2.1 |

*determined by the use of AGS-100G(SHIMADZU Scientific Instruments Inc., U.S.A.) according to ASTM E1876-99
**determined by the use of AGS-100G(SHIMADZU Scientific Instruments Inc., U.S.A.) according to ASTM D882-97

As shown in Table 1, the inventive carbon nanotube composites obtained from thermal polymerization of the surface-modified carbon nanotubes exhibit about 10% or more increase in mechanical strength in comparison with the conventional composites obtained from blending of carbon nanotubes with polymer binders. These results suggest that interpenetrating polymer network formed between carbon nanotubes as well as between carbon nanotubes and polymer binders does much for improving mechanical properties of the inventive carbon nanotube composites.

Simple modifications and changes of the present invention will be readily made by any skilled person in the art and it should be understood that all of such modifications and changes are encompassed within the scope of the present invention.

What is claimed is:

1. A method of forming a negative pattern of carbon nanotubes, wherein the method comprises the steps of:

(a) dispersing carbon nanotubes having surfaces that are modified with an oxirane group of formula (1) and/or with an anhydride group of formula (2), (3), (4), (5), (6) or (7) in an organic solvent comprising one or more photoacid or photobase generator to provide a liquid coating composition:

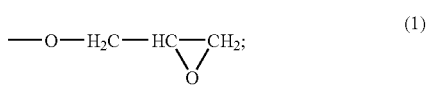

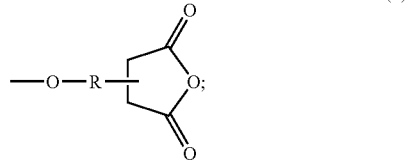

wherein, R is $C_{1-15}$, linear, branched or cyclic alkylene;

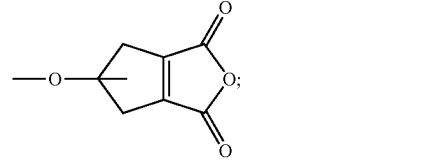

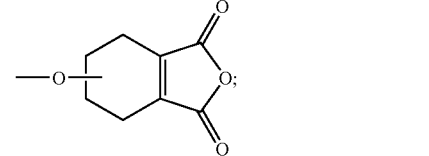

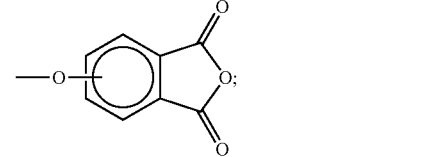

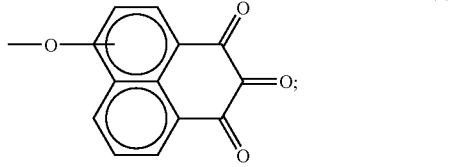

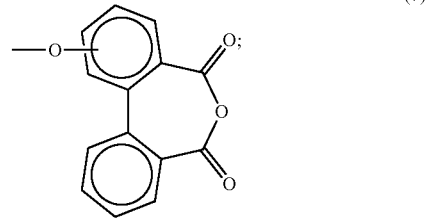

(b) applying the liquid coating composition onto a substrate and evaporating the organic solvent by prebaking to deposit a coating film of said surface-modified carbon nanotubes on the substrate;

(c) exposing the coating film of said surface-modified carbon nanotubes to UV light through a photomask having a desired pattern to induce photopolymerization of the surface-modified carbon nanotubes in exposed areas of the coating film; and (d) developing the exposed coating film of said surface-modified carbon nanotubes with an organic developer to remove unexposed areas of the coating film, resulting in a negative patterned film of said surface-modified carbon nanotubes.

2. The method according to claim 1, wherein the liquid coating composition comprises 3–95 wt % of the surface-modified carbon nanotubes and 0.1–15 parts by weight of the photoacid or photobase generator based on 100 parts by weight of the surface-modified carbon nanotubes.

3. The method according to claim 1, wherein the liquid coating composition further comprises 0.3–2 parts by weight of a photo intensifier based on 100 parts by weight of the surface-modified carbon nanotubes, wherein the photo intensifier is one or more selected from the group consisting of 2-ethyl-9,10-dimethoxyanthracene, 9,10-dichloroanthracene, 1-chloro-anthracene, 2-methylanthracene, 9-methylanthracene, 2-t-butylanthracene, anthracene, 1,2-benzanthracene, 1,2,3,4-dibenzanthracene, 1,2,5,6-dibenzanthracene, 1,2,7,8-dibenz-anthracene, 9,10-dimethoxydimethylanthracene, 2-ethyl-9,10-dimethoxyanthracene, N-methylphenothiazine, and isopropylthioxanthone.

4. The method according to claim 1, wherein the organic solvent used in step (a) is one or more selected from the group consisting of DMF, 4-hydroxy-4-methyl-2-pentanone, ethylene glycol monoethyl ether, 2-methoxyethanol, methoxypropylacetate, ethyl-3-ethoxy-propionate, and cyclohexanone.

5. The method according to claim 1, wherein the liquid coating composition further comprises 0.1–10 parts by weight of a coupling agent based on 100 parts by weight of the surface-modified carbon nanotubes, wherein the coupling agent is one or more selected from the group consisting of aminopropyltriethoxysilane, phenylaminopropyltrimethoxysilane, ureidopropyltriethoxysilane, glycidoxypropyltrimethoxysilane, isocyanatopropyltriethoxysilane, isopropyltriisostearoyltitanate, and acetoalkoxyaluminium diisopropylate.

6. The method according to claim 1, wherein the liquid coating composition further comprises 1–95 parts by weight of an oxirane group-containing monomer, oligomer or polymer, and/or an anhydride group-containing monomer, oligomer or polymer to 100 parts by weight of the surface-modified carbon nanotubes.

7. The method according to claim 1, wherein the liquid coating composition further comprises 1–30 parts by weight of a polymer binder based on 100 parts by weight of the surface-modified carbon nanotubes, wherein the polymer binder is one or more selected from the group consisting of polyester, polycarbonate, polyvinylalcohol, polyvinylbutylal, polyacetal, polyarylate, polyamide, polyamideimide, polyetherimide, polyphenyleneether, polyphenylenesulfide, polyethersulfone, polyetherketone, polyphthalamide, polyethernitrile, polybenzimidazole, polycarbodiimide, polysiloxane, polymethylmethacrylate, polymethacrylamide, nitrile rubber, acryl rubber, polyethylenetetrafluoride, epoxy resin, phenol resin, melamine resin, urea resin, polybutene, polypentene, ethylene-propylene copolymer, ethylene-butene-diene copolymer, polybutadiene, polyisoprene, ethylene-propylene-diene copolymer, butyl rubber, polymethylpentene, polystyrene, styrene-butadiene copolymer, hydrogenated styrene-butadiene copolymer, hydrogenated polyisoprene, and hydrogenated polybutadiene.

8. The method according to claim 1, wherein the method further comprises a step of post curing the exposed coating film after step (c).

9. A method of producing a polymerized carbon nanotube composite, wherein the method comprises the steps of:

(a) dispersing carbon nanotubes having surfaces that are modified with an oxirane group of formula (1) and/or with an anhydride group of formula (2), (3), (4), (5), (6) or (7) in an organic solvent comprising one or more thermal hardener to provide a liquid coating composition:

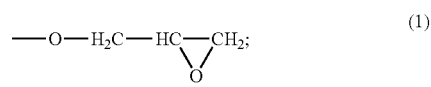

(1)

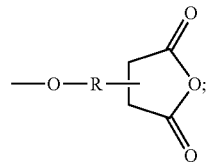

(2)

wherein, R is $C_{1-15}$, linear, branched or cyclic alkylene;

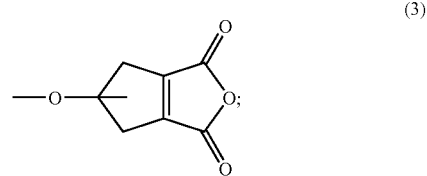

(3)

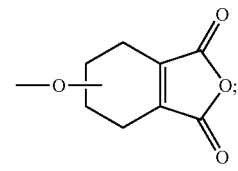

(4)

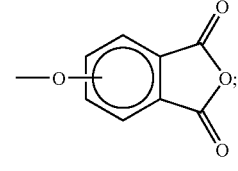

(5)

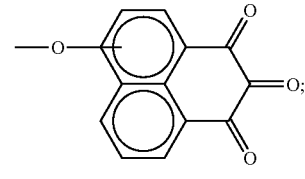

(6)

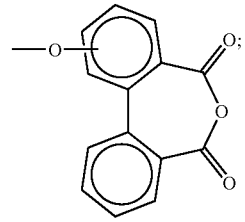

(7)

(b) applying the liquid coating composition onto a substrate and heatcuring to provide a polymerized carbon nanotube composite of said surface-modified carbon nanotubes.

10. The method according to claim 9, wherein the liquid coating composition comprises 3–95 wt % of the surface-modified carbon nanotubes and 1–35 parts by weight of the thermal hardener based on 100 parts by weight of the surface-modified carbon nanotubes.

11. The method according to claim 9, wherein the organic solvent used in step (a) is one or more selected from the group consisting of DMF, 4-hydroxy-4-methyl-2-pentanone, ethylene glycol monoethyl ether, 2-methoxyethanol, methoxypropylacetate, ethyl-3-ethoxypropionate, and cyclohexanone.

12. The method according to claim 9, wherein the liquid coating composition further comprises 0.1–10 parts by weight of a coupling agent based on 100 parts by weight of the surface-modified carbon nanotubes, wherein the coupling agent is one or more selected from the group consisting of aminopropyltriethoxysilane, phenylaminopropyltrimethoxysilane, ureidopropyltriethoxysilane, glycidoxypropyltrimethoxysilane, isocyanatopropyltriethoxysilane, isopropyltriisostearoyltitanate, and acetoalkoxyaluminium diisopropylate.

13. The method according to claim 9, wherein the liquid coating composition further comprises 1–95 parts by weight of an oxirane group-containing monomer, oligomer or polymer, and/or an anhydride group-containing monomer, oligomer or polymer to 100 parts by weight of the surface-modified carbon nanotubes.

14. The method according to claim 9, wherein the liquid coating composition further comprises 1–30 parts by weight of a polymer binder based on 100 parts by weight of the surface-modified carbon nanotubes, wherein the polymer binder is one or more selected from the group consisting of polyester, polycarbonate, polyvinylalcohol, polyvinylbutylal, polyacetal, polyarylate, polyamide, polyamideimide, polyetherimide, polyphenyleneether, polyphenylenesulfide, polyethersulfone, polyetherketone, polyphthalamide, polyethernitrile, polybenzimidazole, polycarbodiimide, polysiloxane, polymethylmethacrylate, polymethacrylamide, nitrile rubber, acryl rubber, polyethylenetetrafluoride, epoxy resin, phenol resin, melamine resin, urea resin, polybutene, polypentene, ethylene-propylene copolymer, ethylene-butene-diene copolymer, polybutadiene, polyisoprene, ethylene-propylene-diene copolymer, butyl rubber, polymethylpentene, polystyrene, styrene-butadiene copolymer, hydrogenated styrene-butadiene copolymer, hydrogenated polyisoprene, and hydrogenated polybutadiene.

* * * * *